(12) United States Patent
Kudo et al.

(10) Patent No.: US 6,642,728 B1
(45) Date of Patent: Nov. 4, 2003

(54) HOLDER OF ELECTROCONDUCTIVE CONTACTOR, AND METHOD FOR PRODUCING THE SAME

(75) Inventors: Masami Kudo, Kanagawa (JP); Toshio Kazama, Nagano (JP); Yoshio Yamada, Nagano (JP); Kazushi Watanabe, Tokyo (JP)

(73) Assignee: NHK Spring Co., Ltd, Kanagawa (JP)

( * ) Notice: Subject to any disclaimer, the term of this patent is extended or adjusted under 35 U.S.C. 154(b) by 0 days.

(21) Appl. No.: 09/744,825

(22) PCT Filed: Jul. 23, 1999

(86) PCT No.: PCT/JP99/03961

§ 371 (c)(1),
(2), (4) Date: May 11, 2001

(87) PCT Pub. No.: WO00/07029

PCT Pub. Date: Feb. 10, 2000

(30) Foreign Application Priority Data

Jul. 30, 1998 (JP) ............................................. 10-215312

(51) Int. Cl.⁷ .............................................. G01R 31/02
(52) U.S. Cl. ....................................... 324/754; 324/761
(58) Field of Search ................................. 324/754, 755, 324/757, 758, 761, 765; 439/66–69, 824

(56) References Cited

U.S. PATENT DOCUMENTS 6,337,572 B1 * 1/2002 Kazama ...................... 324/754

FOREIGN PATENT DOCUMENTS

| JP | 6-201725 | | 7/1994 |
| JP | 06-201725 | * | 7/1994 |
| JP | 6-317624 | | 11/1994 |
| JP | 06-317624 | * | 11/1994 |
| JP | 7-225245 | | 8/1995 |
| JP | 07-225245 | * | 8/1995 |
| JP | 7-253435 | | 10/1995 |
| JP | 07-253435 | * | 10/1995 |

* cited by examiner

*Primary Examiner*—Michael Sherry
*Assistant Examiner*—Russell M. Kobert
(74) *Attorney, Agent, or Firm*—MacPherson Kwok Chen & Heid LLP

(57) ABSTRACT

The holder for an electroconductive contact unit according to the present invention uses a silicon wafer having a laminated structure including a first silicon layer, second silicon layer and silicon oxide film which is disposed between the two silicon layers. A small hole is formed in the first silicon layer for coaxially and slidably guiding a head portion of an electroconductive needle member, and a large hole is formed in the second silicon layer for receiving a flange portion of the needle member and a compression coil spring so that the silicon oxide film serves as a stopper for the flange member. Thus, by finishing the surface of the first silicon layer by lapping, the projecting length of the electroconductive needle member can be defined at a high precision. When the object to be tested consists of a silicon wafer, because the holder is made of the same material as the object to be tested, and they undergo a substantial identical thermal expansion, there is no positional shifting of each electroconductive needle member in simultaneously accessing a plurality of points.

10 Claims, 5 Drawing Sheets

HOLDER OF ELECTROCONDUCTIVE CONTACTOR, AND METHOD FOR PRODUCING THE SAME

TECHNICAL FIELD

The present invention relates to a holder for an electroconductive unit which is suitable for use in testing printed circuit boards, semiconductor devices and semiconductor wafers by resiliently urging an electroconductive needle member by using a compression coil spring, and a method for making such a holder.

BACKGROUND OF THE INVENTION

The same applicant previously proposed an electroconductive contact unit assembly comprising a holder consisting of a plate member serving as a support member provided with a plurality of holes, and an electroconductive needle member and compression coil spring received in each hole to simultaneously access a plurality of points of printed circuit boards and multi-pin semiconductor devices for the purpose of testing them or making required measurements (for instance, Japanese patent laid-open publication No. 6-201725). According to this prior proposal, as there is no need to prepare a large number of tubular holders for the electroconductive needle members, it is possible to minimize the pitch of the electroconductive needle members and adapt the electroconductive contact unit assembly to a higher level of densities of the points to be tested.

When such a holder for an electroconductive contact unit assembly is made by drilling holes in a plastic plate member which is electrically insulating, each hole is given with a first section having a large diameter and a second section having a small diameter so that the projecting length of the electroconductive needle member may be defined as required. However, machining work such as drilling is unsuitable for accurately controlling the distribution of the lengths of the two sections in each hole. Therefore, in the case of an electroconductive contact unit assembly having an extremely large number of contact units for testing semiconductor wafers, fluctuations in the projecting length of each electroconductive needle member is inevitable, and there is some difficulty in achieving a uniform and stable contact for all of the electroconductive needle members.

Furthermore, there has been a growing demand for semiconductor devices that can operate in a high temperature environment, and large semiconductor wafers (having a diameter of 200 mm, for instance) are often required to be tested in a high temperature environment. Therefore, the electroconductive contact unit assembly for measuring multiple points of such semiconductor wafers are also required to have a comparable level of resistance to heat and thermal expansion. However, materials having a comparable level of resistance to heat and a small thermal expansion coefficient are relatively difficult to work, and this tends to lower the production efficiency.

BRIEF SUMMARY OF THE INVENTION

To achieve such objects, the present invention provides a holder for an electroconductive contact unit for axially slidably supporting an electroconductive needle member into and out of the holder, the electroconductive needle member including a head portion adapted to contact an object, and an enlarged diameter portion coaxially provided in the head portion and having a larger diameter than the head portion, a compression coil spring being received in the holder for resiliently urging the enlarged diameter portion in a direction to allow the head portion to project out of the holder, characterized by that: the holder comprises a first silicon layer formed with a small hole for coaxially and slidably guiding the head portion, a second silicon layer formed with a large hole for receiving the enlarged diameter portion and the compression coil spring, a silicon oxide film disposed between the two silicon layers and formed with a communication hole having a same diameter as the small hole and coaxial therewith, and an insulating film formed over the inner circumferential surface of the small hole, large hole and communication hole, the projecting length of the head of the needle member being defined by the abutting of the enlarged diameter portion onto the silicon oxide film.

Thus, by using a silicon wafer having a three-layered structure formed by interposing a silicon oxide film with a thickness in the order of 1 μm between first and second silicon layers, a small hole can be formed in the first silicon layer for coaxially and slidably guiding the head portion by plasma etching conducted under condition which would not affect the silicon oxide film, and a large hole can be similarly formed in the second silicon layer for receiving the enlarged diameter portion and the compression coil spring. Also, a communication hole coaxial with the small hole and having a same diameter as the small hole can be formed in the silicon oxide film by plasma etching under a condition which would not affect the silicon layers. The silicon oxide film serves as a stopper by abutting the enlarged diameter portion of the needle member. Therefore, by finishing the surface of the first silicon layer by lapping or the like, the projecting length of the electroconductive needle member can be defined at a high precision.

The projecting length of the electroconductive needle member can be defined at a high precision also by providing a holder for an electroconductive contact unit for axially slidably supporting an electroconductive needle member into and out of the holder, the electroconductive needle member including a head portion adapted to contact an object, and an enlarged diameter portion coaxially provided in the head portion and having a larger diameter than the head portion, a compression coil spring being received in the holder for resiliently urging the enlarged diameter portion in a direction to allow the head portion to project out of the holder, characterized by that: the holder comprises a silicon oxide layer formed with a small hole for coaxially and slidably guiding the head portion, a silicon layer formed with a large hole for receiving the enlarged diameter portion and the compression coil spring, and an insulating film formed over the inner circumferential surface of the large hole, the projecting length of the head of the needle member being defined by the abutting of the enlarged diameter portion onto the silicon oxide layer.

If the insulating film is formed by a silicon oxide film, the insulating film can be easily formed on the inner circumferential surface of the holes of the two silicon layers by forming a silicon oxide film in the presence of oxygen gas.

If the enlarged diameter portion consists of a radial flange portion, and a stem portion projects from the head portion oppositely from the radial flange portion, the large hole being dimensioned so that the stem portion contacts the compression coil spring as the compression coil spring curves under compressive deformation, an electric signal that is required to be exchanged between the head portion of the electroconductive needle member and the compression coil spring can flow axially along the stem portion up to the point of contact between the stem portion and the compression coil spring, and this contributes to the reduction in the electric inductance and resistance because the electric current is not required to be passed through the compression coil spring along a spiral path.

The present invention also provides a method for making a holder for an electroconductive contact unit for axially slidably guiding an electroconductive needle member into and out of the holder, the electroconductive needle member including a head portion adapted to contact an object, and an enlarged diameter portion coaxially provided in the head portion and having a larger diameter than the head portion, a compression coil spring being received in the holder for resiliently urging the enlarged diameter portion in a direction to allow the head portion to project out of the holder, characterized by the steps of: preparing a silicon wafer having a laminated structure including a first silicon layer, second silicon layer and silicon oxide film which is disposed between the two silicon layers; forming a small hole in the first silicon layer for coaxially and slidably guiding the head portion, and a large hole in the second silicon layer for receiving the enlarged diameter portion and the compression coil spring; forming a communication hole coaxial with the small hole and having a same diameter as the small hole in the silicon oxide film; and forming an insulating film over the inner circumferential surface of the large hole, small hole and communication hole.

Thus, by using a silicon wafer having a laminated structure including a first silicon layer, second silicon layer and silicon oxide film which is disposed between the two silicon layers, and forming a communication hole in the silicon oxide film, the projecting length of the electroconductive needle member can be defined at a high precision by the enlarged diameter portion received in the large hole abutting the silicon oxide film.

By forming the holes in the silicon layers by plasma etching conducted under a condition which would not substantially affect the silicon oxide film, the hole forming work can be conducted at a high precision comparable to the level of precision of the mask for the plasma etching. Also, because the depth of the hole is defined by the silicon oxide film, the pitch of the holes, the diameter and depth of each hole can be controlled at a high precision in the order of $\mu m$ when a plurality of such electroconductive contact units are arranged in parallel to each other.

By forming the communication hole by plasma etching conducted under a condition which would not substantially affect the silicon layers, the communication hole can be formed in the silicon oxide film both easily and at a high precision.

By conducting the plasma etching for forming the communication hole from the side of the small hole, the communication hole having a same diameter as the small hole can be formed at a high precision.

Other features and advantages of the present invention will be described in the following with reference to the appended drawings.

DETAILED DESCRIPTION OF THE PREFERRED EMBODIMENTS

Embodiments of the present invention are now described in the following with reference to the appended drawings.

Figure 1:
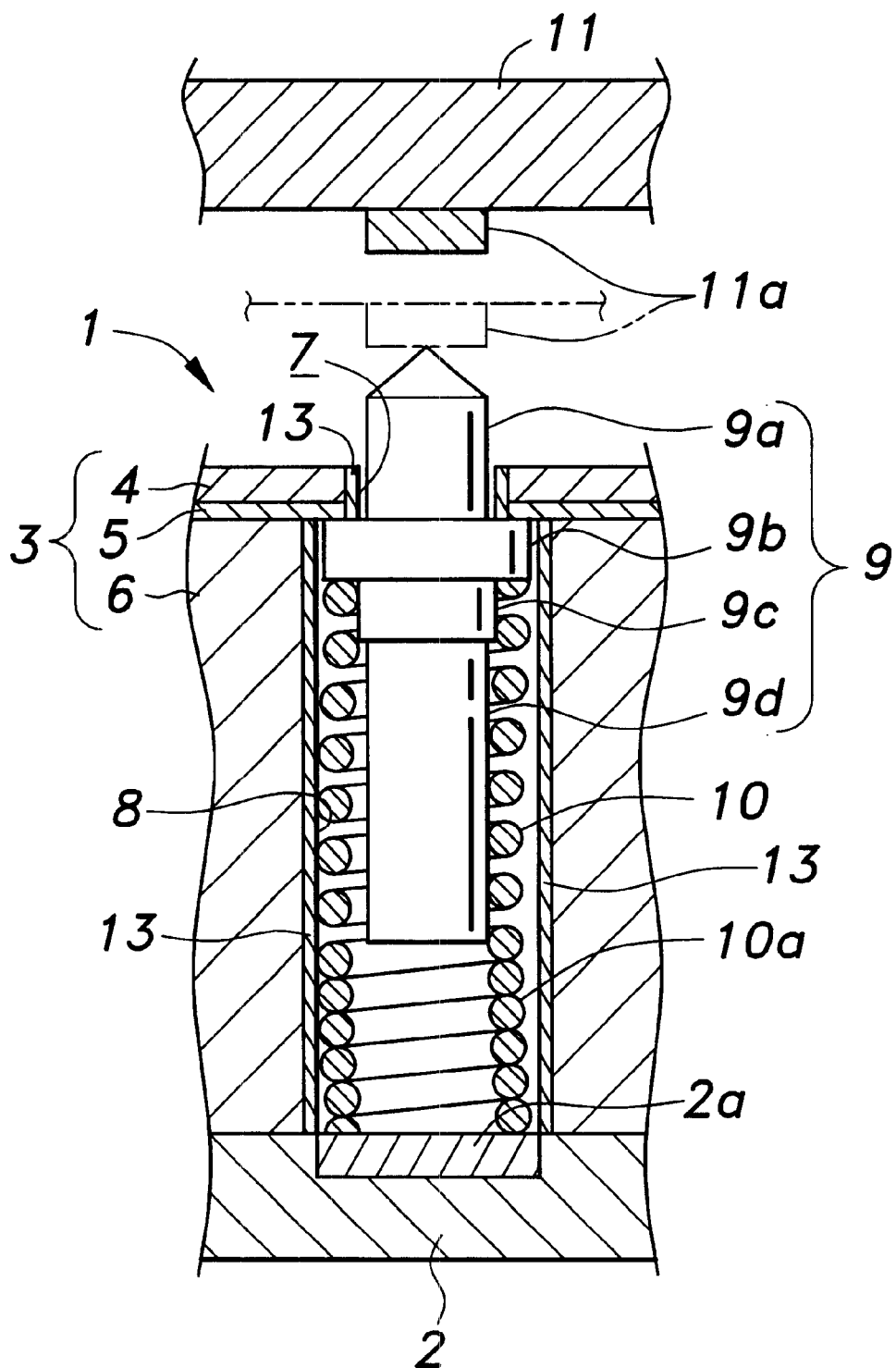
FIG. 1 is a schematic sectional vertical view of an electroconductive contact unit embodying the present invention.

FIG. 1 is a schematic sectional vertical view of an electroconductive contact unit 1 embodying the present invention. Typically, a large number of such electroconductive contact units 1 are arranged one next to another to enable simultaneous measurement of a large number of points of an object to be tested.

In this electroconductive contact unit 1, a circuit board 2 such as a burn-in board in provided in a lower part as seen in the drawing, and the upper surface of the circuit board 2 is provided with a circuit pattern 2a which defines the upper surface of the circuit board 2. A plate member 3 serving as a holder embodying the present invention is placed integrally upon the upper surface of the circuit board 2 as seen in the drawing. The plate member 3 may be joined to the circuit board 2 by fastening means such as threaded bolts not shown in the drawing.

The plate member 3 comprises a first silicon layer 4, silicon oxide film 5 and second silicon layer 6 which are laminated one over another. The first silicon layer 4 and silicon oxide film 5 are formed with a small hole 7 passed across the thickness of the two layers, and the second silicon layer 6 is formed with a large hole 8 passed across the thickness of the second silicon layer 6 coaxially with the small hole 7. The large hole 8 directly faces the circuit pattern 2a. The inner circumferential surface of the small and large holes 7 and 8 is covered by an insulating film 12.

The small hole 7 coaxially and axially slidably supports a head portion 9a of an electroconductive needle member 9, and the large hole 8 coaxially receives a radial flange portion 9b of the electroconductive needle member 9 which is more enlarged than the head portion 9a. The large hole 8 coaxially receives a compression coil spring 10 which has a diameter slightly smaller than the inner diameter of the large hole 8, and is compressed to a prescribed extent between the radial flange portion 9b and the circuit pattern 2a so that the head portion 9a of the electroconductive contact unit 9 resiliently projects outwards. The electroconductive needle member 9 is provided with a boss portion 9c and a stem portion 9d having a slightly smaller diameter than the boss portion 9c which project from the radial flange portion 9b oppositely from the head portion 9a, and coaxially extend into the compression coil spring 10.

The electroconductive contact unit 1 which is assembled as described above can be used for testing semiconductor devices by electric contact. When testing an object 11 to be tested, the pointed end of the head portion 9a of the electroconductive needle member 9 is brought into contact with a terminal 11a of the object 11 to be tested as indicated by the imaginary lines in FIG. 1, and electric signals are exchanged with the circuit board 2 (circuit pattern 2a). The imaginary lines indicate the state of the electroconductive contact unit 1 when an contact is about to be made, and the electroconductive needle member 9 will be pushed into the large hole 8 to some extent against the spring force of the compression coil spring 10 when the measurement actually takes place.

In the electroconductive contact unit 1 according to the present invention, the compression coil spring 10 is somewhat compressed in its assembled state (standby state) so as to produce a certain pre-stress as illustrated in FIG. 1. The pre-stress stabilizes the position of the free end of the head portion 9a.

In the electroconductive contact unit 1 of the present invention, because the compression coil spring 10 curves as it compresses, a part of the inner circumference of the compression coil spring 10 engages the stem portion 9d. The part of the compression coil spring 10 extending between the point of engagement with the stem portion 9d of FIG. 1 and the coil end contacting the circuit pattern 2a in the standby state (assembled state) consists of a closely wound segment.

Therefore, when exchanging signals with the terminal 11a, the electric signals flow along the electroconductive needle member 9 up to the point of contact between the stem portion 9d and the compression coil spring 10, and then along the compression coil spring 10. However, because the stem portion 9d is in contact with the closely wound segment 10a, the electric signals flow along the closely wound segment 10a from the stem portion 9d to the circuit pattern 2a. Because the electric current can flow along a linear path in the axial direction, instead of flowing along a spiral path, the electric inductance and resistance can be both reduced particularly when dealing with high frequency signals.

As shown in the drawing, when the terminal 11a has a flat surface, the projecting end of the head portion 9a of the electroconductive needle member 9 should be pointed so that any film that may be present on the surface of the terminal 11a may be readily pierced, and a favorable electric contact may be established. When the terminal consists of a solder ball, the projecting end of the head portion 9a of the electroconductive needle member 9 should be flat.

Figure 2A:
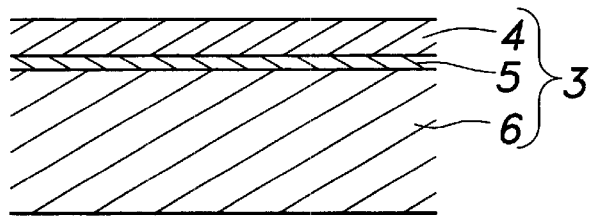
FIG. 2(a) is a fragmentary schematic side view showing the step of forming the silicon oxide film.

An exemplary method of making the plate member embodying the present invention is described in the following with reference to FIGS. 2 and 3. The plate member 3 may consist of SOI (silicon on insulator) formed by laminating the first silicon layer 4, silicon oxide film 5 and second silicon layer 6 as shown in FIG. 2(a). The silicon oxide film has a thickness, for instance, in the order of 1 $\mu$m. The thickness of the first silicon layer 4 is highly precisely controlled by applying a lapping finish to the surface (the upper surface in the drawings) thereof.

Figure 2B:
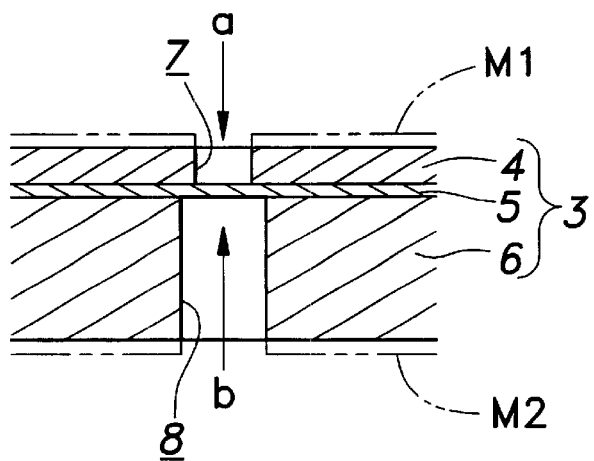
FIG. 2(b) is a fragmentary schematic side view showing the step of forming the large and small holes.

Referring to FIG. 2(b), a pattern mask M1 having an opening for defining the small hole 7 is placed on the surface (upper surface in the drawing) of the first silicon layer 4, and another pattern mask M2 having an opening for defining the large hole 8 is placed on the surface (lower surface in the drawing) of the second silicon layer 6. The small and large holes 7 and 8 are then formed by using an ASM (advanced silicon etching) device based on plasma etching from above and below as indicated by arrows a and b in the drawing. The plasma etching process is conducted under such a condition (environment and output) that the silicon oxide film 5 remains substantially intact. Because the depth of each hole is defined by the silicon oxide film 5, even when a large number of holes are formed in a plate member consisting of a silicon wafer, and the speed of forming each hole may differ from the central part thereof to the peripheral part thereof, all of the holes may be given with a same depth at a high precision.

Figure 2C:
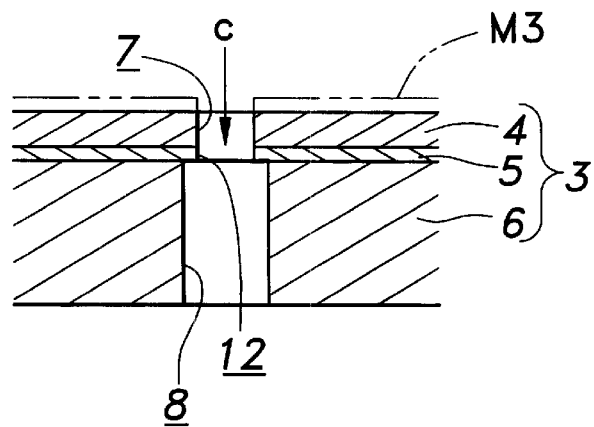
FIG. 2(c) is a fragmentary schematic side view showing the completed holder.

Referring to FIG. 2(c), a third mask M3 formed with openings each having an identical diameter as the small hole 7 is placed over the upper surface of the first silicon layer 4, and the part of the silicon oxide film 5 facing the small hole 7 is removed by applying a plasma etching process from the direction indicated by arrow c in the drawing under a condition (environment and output) different from that of the hole forming process illustrated in FIG. 2(b). Thereby, a communication hole 12 having a same diameter as the small hole 7 and communicating the small hole 7 and large hole 8 with each other is formed in the silicon oxide film 5.

Figure 3:
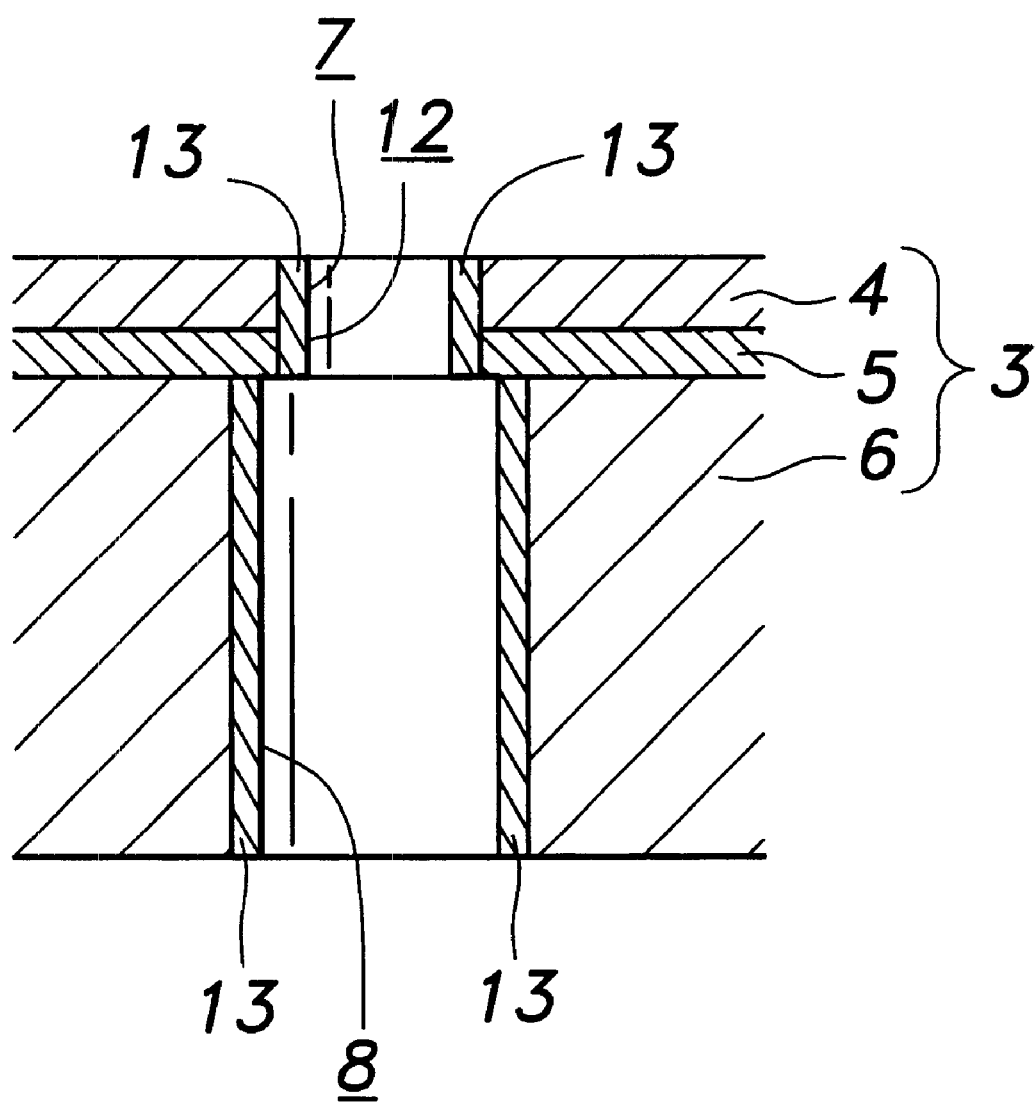
FIG. 3 is a schematic sectional vertical view of a completed holder.

An insulating film 13 is then formed over the inner surface of the through hole defined by the small and large holes 7 and 8 and the communication hole 12 as illustrated in FIG. 3. This insulating film 13 may be formed by heating the SOI wafer in an oxygen environment, and thereby forming a silicon oxide film.

Thus, the radial flange portion 9b received in the large hole 8 of the electroconductive needle member 9 is resiliently pushed against the silicon oxide film 5 under the resilient spring force of the compression coil spring 10 so that the radial flange portion 9b abuts the side of the silicon oxide film 5 facing the large hole 8. The shoulder defined by the part of the silicon oxide film 5 facing the large hole 8 thus serves as a stopper for defining the projecting length of the head portion 9a of the electroconductive needle member 9.

By forming the silicon oxide film 5 as described above, the depth of the small hole 7 can be controlled at a high precision in the order of $\mu$m. By lapping the surface (upper face) of the first silicon layer 4, the thickness as measured from the silicon oxide film 5 to the surface (upper face) of the first silicon layer 4 can be controlled at a high precision. As a result, the projecting length of the head portion 9a (the projecting length as measured from the upper surface of the first silicon layer 4 in FIG. 1) can be controlled at a high precision.

The electroconductive contact unit 1 according to the present invention is suitable for applications where a large number of terminals are required to be accessed at the same time for measurement. Although only one electroconductive contact unit is illustrated in FIG. 1, it should be understood that the test assembly may include a plurality of such electroconductive contact units which are arranged in parallel to each other in a plate member 3. When an object having a large area such as a silicon wafer (for instance, having a diameter of 200 mm) is required to be tested at a plurality of points thereof, the plate member 3 should have a correspondingly large area.

When a plurality of points are accessed at the same time by using such an assembly having a large area, because the present invention allows the projecting length of the electroconductive needle members to be uniform at a high precision, a favorable state of contact can be achieved at all times.

In a test involving a high temperature environment as is the case with a wafer-level burn-in (WLBI) test for silicon wafers, if there is any excessive thermal expansion of the plate member 3, even when one electroconductive contact unit is matched with a corresponding point on the wafer, another electroconductive contact unit remote from the one electroconductive contact unit may be unable to match with the corresponding point on the wafer. However, according to the present invention, because the plate member 3 consists of the same material as the silicon wafer, there is no difference in thermal expansion between them, and such a positional shift can be avoided.

For instance, in the case of an eight-inch silicon wafer having a large number (for instance, 22,400) of points to be accessed, it is necessary to form a same number of holes in the plate member 3. The plasma etching used in the present invention is suited for simultaneously forming a large number of holes, and can be readily adapted for mass production. Also, because the plasma etching process can form holes substantially at a same precision level as that of the pattern mask used for the etching process, and the silicon oxide film 5 can be formed to a thickness in the order of 1 $\mu$m, the pitch of the holes, the diameter and depth of each hole can be controlled at a high precision in the order of $\mu$m.

Thus, according to the present invention, because the shoulder defined between the two sections of the hole having different diameters is formed with a silicon oxide film, and serves as a stopper for defining the projecting length of the electroconductive needle member, the thickness of the first silicon layer as measured between the interface with the silicon oxide film and the surface of the first silicon layer can be accurately controlled by appropriately finishing the surface of the SOI wafer (the surface of the first silicon layer 4). This, combined with the fact that the silicon oxide film is given with a thickness in the order of 1 $\mu$m, allows the projecting length of the electroconductive needle member to be controlled at a high precision. Also, because the holder is made of the same material as the object to be tested when the object to be tested consists of a silicon wafer, and they undergo a substantial identical thermal expansion, there is no positional shift of each electroconductive needle member when simultaneously accessing a plurality of points.

Figure 4:
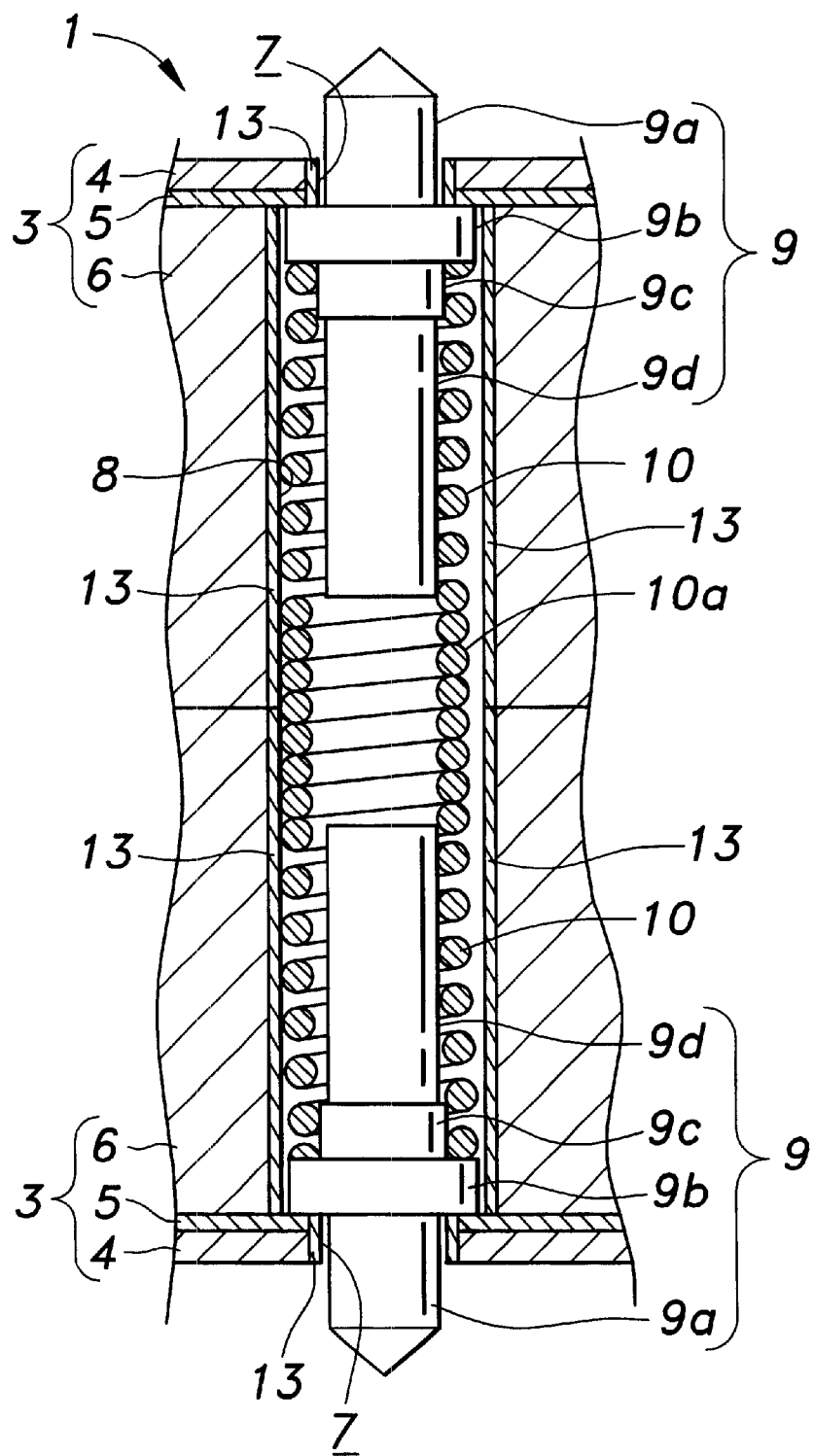
FIG. 4 is a view similar to FIG. 1 showing an electroconductive contact unit having two moveable ends.

The foregoing description was related to an electroconductive contact unit having only one moveable end, but the present invention is equally applicable to an electroconductive contact unit having two moveable ends, and such an example is illustrated in FIG. 4. The parts corresponding to the previous embodiment are denoted with like numerals without repeating the description of such parts.

In the embodiment illustrated in FIG. 4, a pair of three-layered holders 3 are formed symmetric to each other, and are bonded together by using a bonding agent or the like. A compression coil spring 10 is coaxially received in the large hole 8 thereof. The compression coil spring 10 of the illustrated embodiment comprises a pair of coarsely wound segments formed on either coil end thereof, and a closely wound segment 10a formed in an intermediate part thereof.

A pair of electroconductive needle members 9 each similar to the electroconductive needle member of the previous embodiment are provided on either coil end of the compression coil spring 10 with their projecting ends facing away from each other. The stem portion 9d of each electroconductive needle member 9 is in contact with the inner circumference of the closely wound segment 10a.

In this electroconductive contact unit also, the projecting length of each electroconductive needle member 9 is defined by the abutting engagement of the radial flange portion 9b with the silicon oxide layer 5 under the spring force of the compression coil spring 10. Therefore, the projecting length of each electroconductive needle member of the electroconductive contact unit having two moveable ends can be controlled at a high precision in a similar manner as in the previous embodiment.

A third embodiment of the present invention is described in the following with reference to FIG. 5. The parts corresponding to the previous embodiments are denoted with like numerals without repeating the description of such parts.

Figure 5:
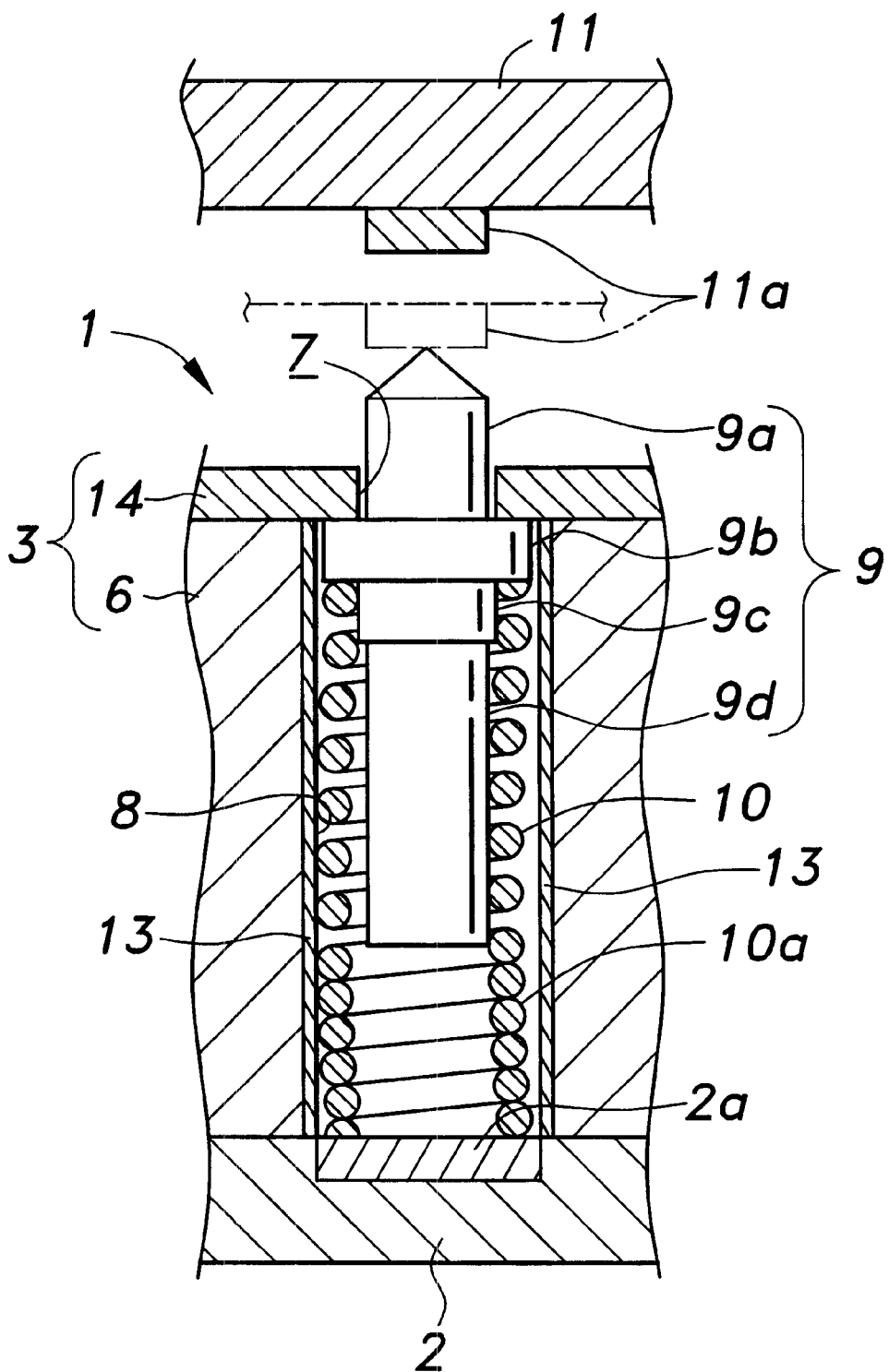
FIG. 5 is a view similar to FIG. 1 showing a third embodiment of the present invention.

In the embodiment illustrated in FIG. 5, the first silicon layer 4 and silicon oxide film 5 in FIG. 1 are replaced by a single silicon oxide layer 14. Thereby, the insulating film on the inner circumferential surface of the small hole 7 can be omitted, and the hole forming process may be accomplished in the two steps of forming the small hole 7 and forming the large hole 8. This contributes to the simplification of the manufacturing process. This embodiment provides otherwise similar advantages as the previous embodiments.

What is claimed is:

1. A holder for an electroconductive contact unit for axially slidably supporting an electroconductive needle member into and out of the holder, the electroconductive needle member including a head portion adapted to contact an object, and an enlarged diameter portion coaxially provided in the head portion and having a larger diameter than the head portion, a compression coil spring being received in the holder for resiliently urging the enlarged diameter portion in a direction to allow the head portion to project out of the holder, characterized by that:

the holder comprises a first silicon layer formed with a small hole for coaxially and slidably guiding the head portion, a second silicon layer formed with a large hole for receiving the enlarged diameter portion and the compression coil spring, a silicon oxide film disposed between the two silicon layers and formed with a communication hole having a same diameter as the small hole and coaxial therewith, and an insulating film formed over the inner circumferential surface of the small hole and large hole, the projecting length of the head of the needle member being defamed by the abutting of the enlarged diameter portion onto the silicon oxide film.

2. A older for an electroconductive contact unit according to claim 1, wherein the insulating film is formed by a silicon oxide film.

3. A holder for an electroconductive contact unit according to claim 1, wherein the enlarged diameter portion consists of a radial flange portion, and a stem portion projects from the head portion oppositely from the radial flange portion, the large hole being dimensioned so that the stem portion contacts the compression coil spring as the compression coil spring curves under compressive deformation.

4. A holder for an electroconductive contact unit for axially slidably supporting an electroconductive needle member into and out of the holder, the electroconductive needle member including a head portion adapted to contact an object, and an enlarged diameter portion coaxially provided in the head portion and having a larger diameter than the head portion, a compression coil spring being received in the holder for resiliently urging the enlarged diameter portion in a direction to allow the head portion to project out of the holder, characterized by that:

the holder comprises a silicon oxide layer formed with a small hole for coaxially and slidably guiding the head portion, a silicon layer formed with a large hole for receiving the enlarged diameter portion and the compression coil spring, and an insulating film formed over the inner circumferential surface of the large hole, the projecting length of the head of the needle member being defined by the abutting of the enlarged diameter portion onto the silicon oxide layer.

5. A holder for an electroconductive contact unit according to claim 4, wherein the insulating film is formed by a silicon oxide film.

6. A holder for an electroconductive contact unit according to claim 4, wherein the enlarged diameter portion consists of a radial flange portion, and a stem portion projects from the head portion oppositely from the radial flange portion, the large hole being dimensioned so that the stem portion contacts the compression coil spring as the compression coil spring curves under compressive deformation.

7. A method for making a holder for an electroconductive contact unit for axially slidably guiding an electroconductive needle member into and out of the holder, the electroconductive needle member including a head portion adapted to contact an object, and an enlarged diameter portion coaxially provided in the head portion, and having a larger diameter than the head portion, a compression coil spring being received in the holder for resiliently urging the enlarged diameter portion in a direction to allow the head portion to project out of the holder, characterized by the steps of:

preparing a silicon wafer having a laminated structure including a first silicon layer, second silicon layer and silicon oxide film which is disposed between the two silicon layers;

forming a small hole in the first silicon layer for coaxially and slidably guiding the head portion, and a large hole in the second silicon layer for receiving the enlarged diameter portion and the compression coil spring;

forming a communication hole coaxial with the small hole and having a same diameter as the small hole in the silicon oxide film; and forming an insulating film over the inner circumferential surface of the large hole and small hole.

8. A method for making a holder for an electroconductive contact unit according to claim 7, wherein the holes in the silicon layers are formed by plasma etching conducted under a condition which would not substantially affect the silicon oxide film.

9. A method for making a holder for an electroconductive contact unit according to claim 8, wherein the communication hole is formed by plasma etching conducted under a condition which would not substantially affect the silicon layers.

10. A method for making a holder for an electroconductive contact unit according to claim 9, wherein the plasma etching for forming the communication hole is conducted from the side of the small hole.

* * * * *